(12) United States Patent
Goldsmith et al.

(10) Patent No.: US 9,718,146 B2
(45) Date of Patent: Aug. 1, 2017

(54) SYSTEM AND METHOD FOR CALIBRATING LASER PROCESSING MACHINES

(71) Applicant: Mitsubishi Electric Research Laboratories, Inc., Cambridge, MA (US)

(72) Inventors: Abraham M Goldsmith, Boston, MA (US); Scott A Bortoff, Brookline, MA (US); Vijay Shilpiekandula, Saratoga Springs, NY (US); Alan Sullivan, Middleton, MA (US); William S Yerazunis, Acton, MA (US); John C Barnwell, III, Leominster, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 511 days.

(21) Appl. No.: 13/908,190

(22) Filed: Jun. 3, 2013

(65) Prior Publication Data

US 2014/0355005 A1    Dec. 4, 2014

(51) Int. Cl.
| | |
|---|---|
| *G01B 11/25* | (2006.01) |
| *B23K 26/00* | (2014.01) |
| *H01S 3/00* | (2006.01) |
| *G03F 9/00* | (2006.01) |
| *G01J 1/42* | (2006.01) |

(52) U.S. Cl.
CPC .......... *B23K 26/00* (2013.01); *G01B 11/2504* (2013.01); *G01J 1/4257* (2013.01); *G03F 9/7019* (2013.01); *H01S 3/0014* (2013.01)

(58) Field of Classification Search
CPC ... G01B 11/2504; G03F 9/7019; G01J 1/4257

USPC .......................................................... 356/614
See application file for complete search history.

(56) References Cited

U.S. PATENT DOCUMENTS

| | | | |
|---|---|---|---|
| 4,918,284 A | | 4/1990 | Weisz |
| 4,941,082 A | * | 7/1990 | Pailthorp ............... B23K 26/04 219/121.78 |
| 6,067,152 A | * | 5/2000 | Rando ....................... 356/152.1 |
| 6,808,117 B2 | | 10/2004 | Han |
| 7,006,237 B2 | | 2/2006 | Iwata |

* cited by examiner

*Primary Examiner* — Rebecca C Bryant
(74) *Attorney, Agent, or Firm* — Gene Vinokur; James McAleenan; Hironori Tsukamoto

(57) ABSTRACT

A method calibrates a laser processing machine by commanding a scan head to direct a laser beam to a desired position, then senses an actual position of the laser beam directly using a position sensitive detector (PSD) after the scan head is positioned. A relative position between the scan head and PSD is altered using one or more linear actuators. A position feedback loop is closed around the linear actuators so that the relative position of the laser beam on the PSD is reduced to zero. The actual position of the laser spot is then measured indirectly by encoders attached to linear axes of the laser processing machine. The actual position is stored in a memory. An error is determined as a difference between the desired position and the actual position. Compensation coefficients are determined from the error and stored for later use during operation of the laser processing machine.

18 Claims, 5 Drawing Sheets

SYSTEM AND METHOD FOR CALIBRATING LASER PROCESSING MACHINES

FIELD OF THE INVENTION

The present invention relates generally to calibrating laser processing machines, and more particularly to a system and method for correcting positioning errors of laser beams of the laser processing machines.

BACKGROUND OF THE INVENTION

Laser processing machines direct a laser beam at a work piece to cut, drill, weld, or otherwise machine the work piece. Many laser processing machines use a pair of galvanometers to rotate mirrors to direct the laser beam along two perpendicular axes. Such systems incorporate a scan lens, also known as an F-theta lens, which linearizes the relationship between mirror angle and laser beam position, produces a flat field, and focuses the laser beam to a spot on the work piece. Collectively, the galvanometers, mirrors, and the F-theta lens are often referred to as a scan head.

Laser processing machines that incorporate the scan head can operate at relatively high speeds. However, the size of the work area is limited by the size of the F-theta lens and the rotational limits of the galvanometers. To enlarge the working area beyond the limits of the scan head, some laser processing machines include a second set of actuators that move either the scan head or the work piece such that the working area of the scan head can be made to overlap different parts of the overall processing area of the machine.

Position sensitive detectors (PSDs) are photodiodes that are used as optical position sensors. PSDs include two classes. Segmented PSDs are common substrate photodiodes that are partitioned into either two or four active regions, for one or two dimensional measurements respectively, separated by inactive gaps. Each region provides a photocurrent output. Lateral effect PSDs are single element photodiodes with no inactive regions that provide two current outputs for each sensing axis. For both segmented and lateral effect PSDs, the position of the beam on the surface of the detector is determined by comparing the photocurrents flowing to or from each of the outputs of the PSDs.

Typically, a feedback control system is used to control the motion of the various actuators in the laser processing machine. Feedback devices, such as encoders and resolvers, provide position and angle information about the axes to the controller. The ideal relationship between the actuator positions and the position of the laser beam on the work piece is known a priori, thereby allowing the controller to generate positioning command signals for the actuators that result in proper positioning of the laser beam. During operation, the controller determines the commands given to the actuators in order reduce a difference between the desired actuator position and the current actuator position, commonly known as the error, to zero.

It is important to note that the feedback control system does not directly control the position of the laser beam on the work piece. Rather, the feedback system controls the positions and angles of various actuators that direct the laser beam to the desired position. This distinction is a major source of error in the position of the laser beam. The feedback control system can only eliminate errors for which feedback is received. Because there is no feedback on the actual position of the laser beam, discrepancies between the ideal and actual relationship of actuator position to laser beam position cannot be eliminated by the feedback action of the control system. Errors of this sort can only be addressed by calibration.

Most laser processing machines require calibration to achieve required levels of accuracy. In particular, laser processing machines that incorporate a scan head require calibration to compensate for many factors including errors in beam alignment, errors in mirror alignment, errors in the mirror angle feedback devices, F-theta lens alignment, distortion in the F-theta lens, and other sources.

Calibration systems and methods for these error sources generally have two primary characteristics. First, the systems include a measurement apparatus that records the actual position of the laser beam for one or more desired positions during calibration. Second, they include some method for processing the resulting stored data, and then using the data to correct the actuator commands during on-line operation of the machine, such that the accuracy of the position of the laser beam on the work piece is improved. Numerous calibration techniques exist in the art, as illustrated by the following examples.

U.S. Pat. No. 4,918,284-1990 describes a laser trimming device. The device uses a camera to acquire images of the work surface via the deflection unit and the F-Theta lens, in conjunction with a specially patterned calibration plate. The deflection unit directs the beam at the calibration plate. Images of the plate are analyzed to determine a difference between desired and actual positions of the laser beam.

U.S. Pat. No. 6,808,117 describes a method and apparatus for calibrating a laser chip scale marking machine. The apparatus uses a camera for determining positioning errors. However, that camera does not image via an optical path of the laser beam. Rather, the camera is located on a side of the work piece opposite the F-Theta lens. The beam is directed at a target installed in place of the work piece and the position where the beam impinges on the target is observed with the camera. The error is measured as the difference between the desired and actual position of the laser beam on the target.

U.S. Pat. No. 7,006,237 describes a method for calibrating a laser processing machine. Holes are marked on a test work piece and the positions of the holes are measured using a camera during off-line operation. The difference between the desired and actual positions is used by a controller to determine an unknown parameter matrix. This matrix is used during on-line operation to determine the optimal command value to direct the laser beam to the desired position on the work piece.

U.S. application Ser. No. 13/346,809 filed by assignee of the present application describes calibrating a laser cutting machine using a calibration plate arranged to simulate the work piece. Two quad photodiodes are positioned to receive light from the surface of the calibration plate via the optical path of the laser beam, and convert an image of a portion of a surface of the calibration plate into electrical signals for calibration purposes.

SUMMARY OF THE INVENTION

It is the object of the present invention to provide a method and system for calibration of laser processing machines. The method applies to laser processing machines that include a scan head and have one or more actuators, such as a laser processing machine that includes a scan head for positioning the laser beam along an X and Y axis on the work piece and a table, composed of an X and a Y axis actuator, for moving the work piece under the scan head.

During calibration the scan head is commanded to direct the laser beam to a set of desired positions in the working plane. A position sensitive detector (PSD) is arranged in the optical path of the laser beam at a working plane of the laser processing machine.

A position control feedback loop is arranged between the X and Y outputs of the PSD and the actuators. At each desired position, the control loop commands the actuators to alter a relative position between the laser beam and PSD by centering the laser beam on the PSD. After the output of the PSD indicates that the laser beam is within some small threshold distance from the center, the measurement device of the actuator is used to measure the actual position of the laser beam in the working plane of the scan head.

The actual positions are processed and a difference between the desired and actual positions of the laser beam is determined. The difference is used to determine compensations coefficients used during on-line machine operation to improve the accuracy of the laser beam position on the work piece.

DETAILED DESCRIPTION OF THE PREFERRED EMBODIMENT OF THE INVENTION

Laser Processing Machine

Figure 1A:
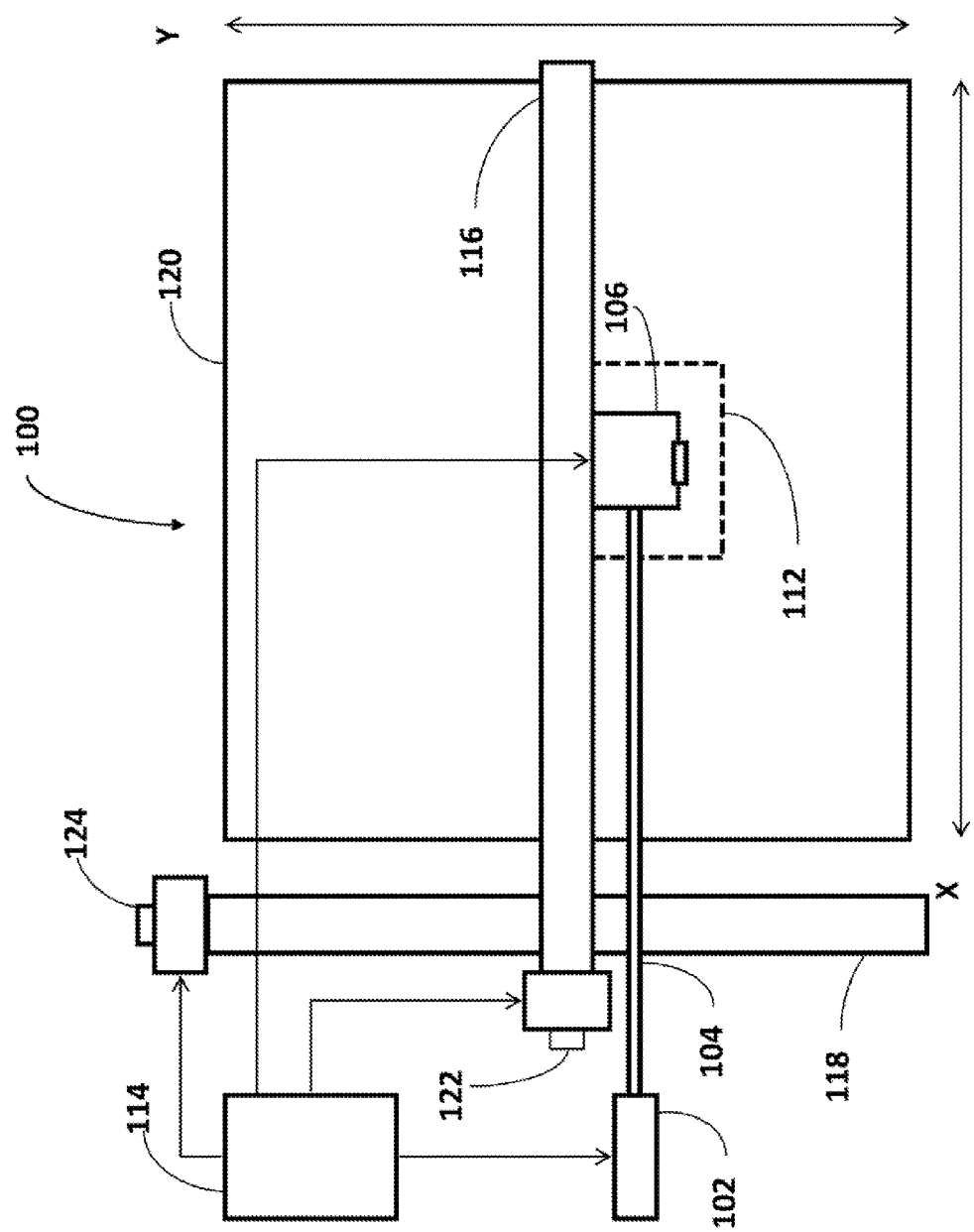
FIG. 1A is a schematic XY perspective diagram of a laser processing machine according to some embodiment of the invention.
Figure 1B:
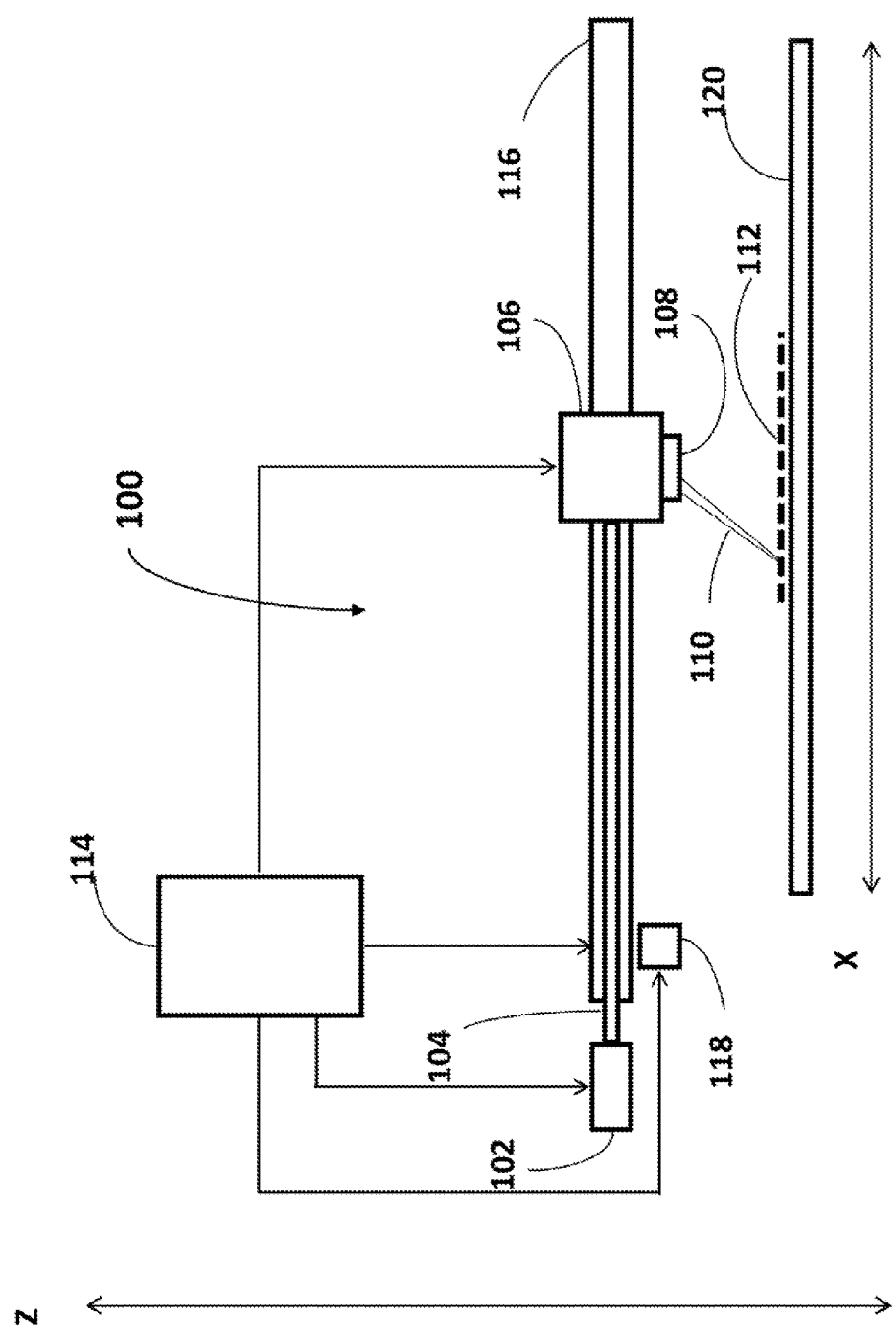
FIG. 1B is a schematic XZ perspective diagram of the laser processing machine of FIG. 1A according to some embodiment of the invention.

FIGS. 1A and 1B show a laser processing machine 100 according to embodiments of our invention. A laser light source 102 directs a laser beam 104 at a scan head 106. The scan head deflects the laser beam through an F-theta lens 108, which focuses a beam 110 at a working plane 112. A control processor 114 sends deflection commands to the scan head as well as to a pair of actuators 116 and 118 that move the scan head along X and Y axes of the laser processing machine, respectively. The motion along the X and Y axes allows the working plane of the scan head to cover the entire working area of the machine 120. Encoders 122 and 124 measure the position of the X and Y actuators.

Figure 1C:
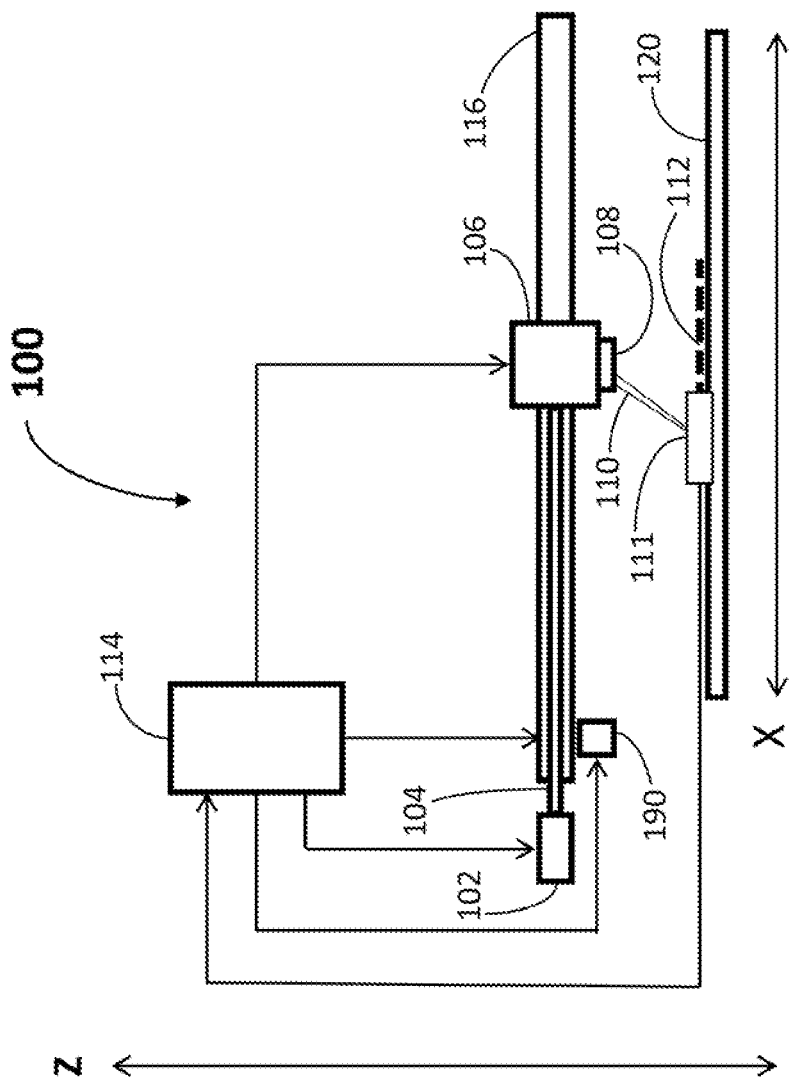
FIG. 1C is a schematic diagram of the laser processing machine augmented with a PSD for measuring positions of the laser beam according to some embodiment of the invention.

FIG. 1C shows the same laser processing machine 100, augmented with a position sensitive detector (PSD) 111 to directly measure the actual position of the laser beam along its optical path of the laser beam at the working plane for the control processor 114.

Calibration System and Method

Figure 2:
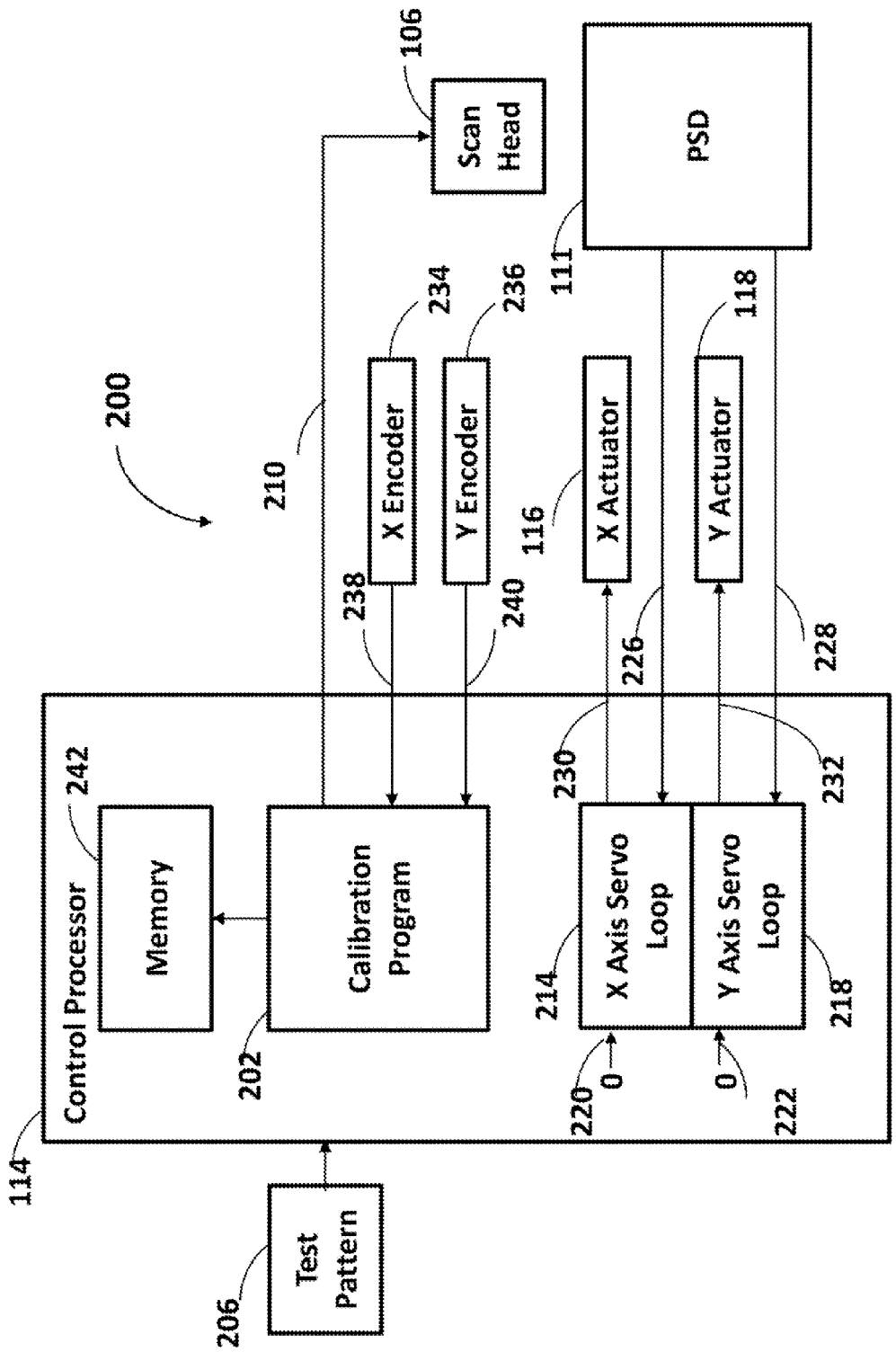
FIG. 2 is a schematic of a calibration system according to embodiments of the invention.

FIG. 2 shows a schematic diagram of the calibration system and method 200. A calibration program 202 is executed on the control processor 204 of the laser processing machine. The calibration program reads in a test pattern 206, which includes a set of positions at the working plane of the scan head 106. The calibration program iterates through the test pattern, translating each position into a position command 210 at each step.

At each position in the test pattern, an X actuator 116 is controlled by an X servo loop 214 and a Y actuator 118 is controlled by a Y servo loop 218. A control input 220 given to the X servo loop and a control input 222 given to the Y servo loop are always zero. The PSD 111 generates an X position signal 226 and a Y position signal 228 that directly indicate the actual X and Y position of the laser beam on the PSD. The X servo loop sends a control output 230 to the X actuator, and the Y servo loop sends a control output 232 to the Y actuator.

In the preferred embodiment the X and Y actuators move the scan head relative to the PSD. However, the calibration method described herein is also valid for embodiments in which the X and Y actuators move the PSD relative to the scan head. In either case, the effect of the relative motion is to change the position of the laser beam on the surface of the PSD.

The control action of the X and Y servo loops determine the X and Y control outputs so as to reduce a difference between the X and Y control inputs and the X and Y PSD position signals to zero. In other words, each servo loop causes the corresponding actuator to alter the relative position of the scan head and PSD until the position signals of the PSD are zero, which indicates that the beam is at the exact center of the PSD. When this condition is met, the actuator position represents the actual position of the laser beam in the working plane of the machine. In the preferred embodiment, the X and Y servo loop are of the proportional integral (PI) type. However, the type of control is not critical to the invention as long as the control action reduces the PSD position signals to zero.

An X encoder device 122 and a Y encoder device 124 measure the position of the X and Y actuators along electromechanical paths of the laser processing machine. The X encoder position signal 238 and the Y encoder position signal 240 indirectly measure the actual position of the laser beam after the servo loops have driven the PSD position signals to zero. The encoder position signals are recorded by the calibration program for each desired position in the test pattern. After the calibration program finishes processing all of the positions in the test pattern, the positions are further processed and the difference between the desired and actual laser beam positions is determined. Compensation coefficients are determined from these differences and stored in the memory 242 of the control processor for use during normal processing operations.

Figure 3:
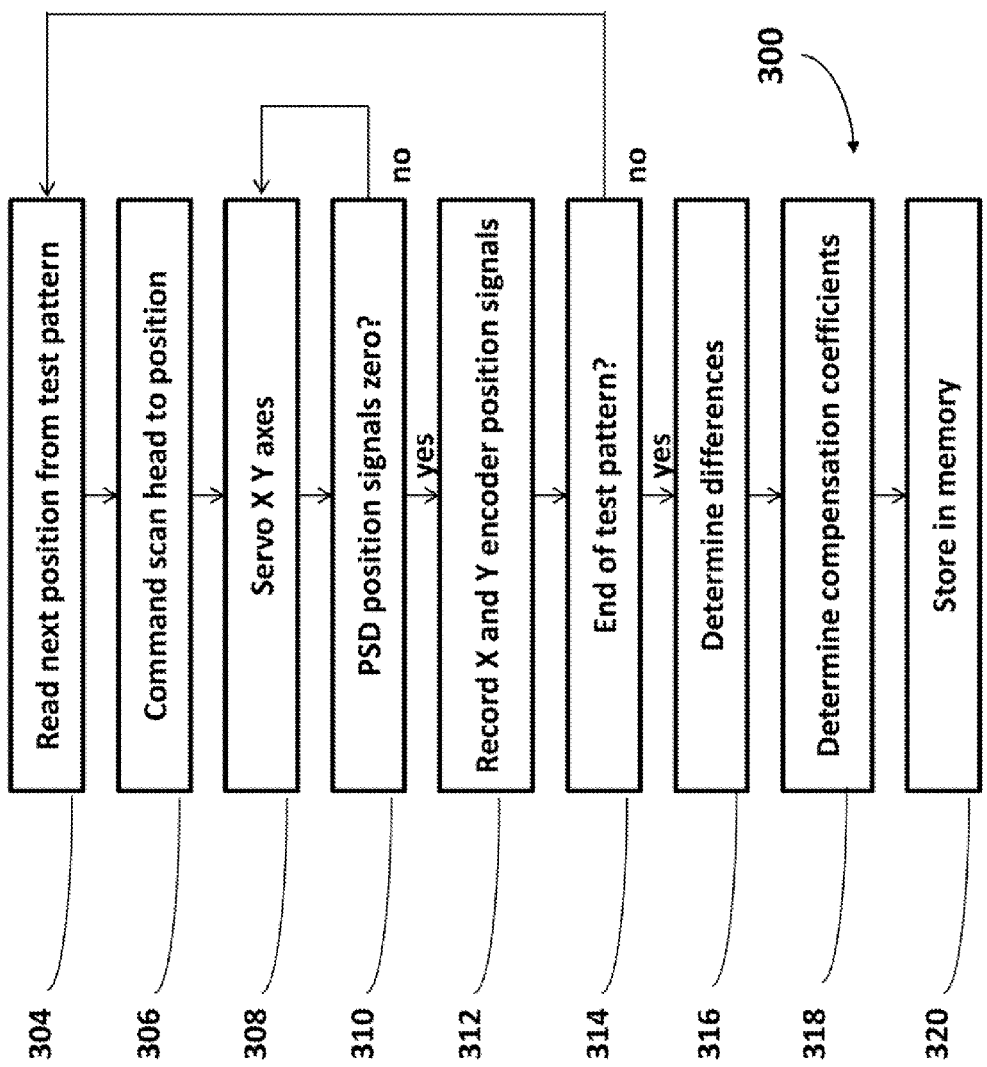
FIG. 3 is a flow diagram of a calibration method according to some embodiment of the invention.

FIG. 3 shows a calibration method 300 according to embodiments of the invention. Starting with the first position in the test pattern, the calibration method receives the next position 304 from the test pattern. A command is sent 306 to the scan head to direct the laser beam to the desired position. The X and Y servo loops move the axes 308 unit until the PSD position signals are zero 310.

In practice, a small threshold around zero is used to account for the presence of noise in the PSD position signals. When the servo operation is complete the actual positions of the X and Y encoders are recorded 312. The calibration program then checks 314 if there are any more desired positions to be processed. If there are more positions, the method repeats starting from 304. If there are no more positions to be processed, the calibration method determines 316 the difference between the desired and actual laser beam positions, henceforth known as the error.

The error can be represented as:

$$e_x = X_d - X_m \text{ and } e_y = Y_d - Y_m,$$

where $e_x$ is a component of the error along the X axis, $X_d$ is the desired position of the laser beam along the X axis, $X_m$ is the measured actual position of the laser beam along the X axis, $e_y$ is a component of the error along the Y axis, $Y_d$ is the desired position of the laser beam along the Y axis, and $Y_m$ is the measured actual position of the laser beam along the Y axis.

In the preferred embodiment of the invention, the errors $e_x$ and $e_y$ are approximated by the polynomial equations $$E_x(x,y) = \sum_{i=0}^{l_x} \sum_{j=0}^{l_y} a_{x_{ij}} x^i y^j \text{ and}$$

$$E_y(x,y) = \sum_{i=0}^{l_x} \sum_{j=0}^{l_y} a_{y_{ij}} x^i y^j,$$

where $E_x(x,y)$ and $E_y(x,y)$ are functions that approximate the measured errors along the X and Y axes respectively, $a_{x_{ij}}$ and $a_{y_{ij}}$ are compensation coefficients for the X and Y axis respectively, and $l_x$ and $l_y$ are the order of the polynomial in X and Y respectively.

The compensation coefficients are determined 318 by solving a non-linear least squares problem that minimizes a cost function representing the difference between the value of the polynomial representation and the actual measured errors, formulated as $$J_x(x,y) = [E_x(x,y) - \|e_x\|]^2 \text{ and}$$

$$J_y(x,y) = [E_y(x,y) - \|e_x\|]^2,$$

where $J_x(x,y)$ and $J_y(x,y)$ are cost functions for X and Y.

The determination of the compensation coefficients is performed off-line in a preprocessing step and then stored 320 in the memory for use during on-line operation of the machine.

During operation of the laser processing machine, the control processor generates a set of X and Y coordinates, which correspond to desired positions, as commands for the scan head. These commands are compensated by calculating an X and Y error approximation using the compensation coefficients $a_{x_{ij}}$ and $a_{y_{ij}}$ stored in memory during the off-line calibration.

The compensated X and Y commands, $X_{comp}$ and $Y_{comp}$ are then generated by adding the approximated error, $E_x(x,y)$ and $E_y(x,y)$, to the X and Y scan head commands as $$X_{comp} = X + E_x(x,y), \text{ and}$$

$$Y_{comp} = Y + E_y(x,y).$$

The basic realization of the invention is the closure of the position feedback, loop around the X and Y actuators and the PSD position signals. This technique has several important advantages over other calibration techniques.

The accuracy of this technique is independent of the linearity of the sensor. Most PSDs, lateral effect PSDs in particular, exhibit some non-linearity over their light sensitive area which is generally worse near the outer edges. The invention uses the exact center of the PSD, thereby eliminating the effect of any non-linearity.

The actual position measurement that is used for calibration is made with the encoders of the machine, not the PSD. The axes of the PSD do not need to be aligned to those of the laser processing machine. Because the center of the PSD is used, rotation of the PSD relative to the machine has no effect on the measurement. The PSD has a small cost and higher accuracy when compared with camera based systems, and the computational requirements for processing the PSD position signals and performing the calibration method are minimal. The method can be implemented in a relatively simple processor connected to memory and input/output interfaces.

The accuracy of the method is generally limited only by the accuracy of the encoders on the laser processing machine and the noise floor of the PSD. Electrical noise corresponding to position errors on the order 0.1 microns are achievable with PSDs, while the encoders on typical laser processing machines are only accurate to at least 1.0 micron. Accuracy of 10 microns is generally considered acceptable for high quality laser processing, making our technique ideal for such tasks.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for calibrating a laser processing machine, the laser processing machine including a processor in communication with a memory, the method comprising:
   obtaining a set of stored desired calibration positions on a work surface of the laser processing machine from the memory;
   directing a scan head to position a laser beam to a desired calibration position from the set of desired calibration positions on the work surface, wherein the work surface is configured to receive a work piece;
   aligning the laser beam of the scan head with a working area of a light sensor, wherein the light sensor is located on the work surface during calibration;
   measuring indirectly by at least one position feedback device, along electromechanical paths of at least one actuator of the laser processing machine, an initial actual position of the laser beam;
   using a servo loop configured to control positions of the at least one actuator using measured position signals of the light sensor via the processor, wherein the light sensor measures a position of the laser beam relative to a center of the working area of the light sensor, such that the servo loop causes the at least one actuator to alter a position of the laser beam to a center of the working area of the light sensor;
   measuring indirectly by the at least one position feedback device, along electromechanical paths of at least one actuator of the laser processing machine, a final actual position of the laser beam after the servo loop centers the laser beam on the center of the working area of the light sensor;
   determining, the difference between the initial actual position and the final actual position for the desired calibration position;
   continuing to determine, the difference between each initial actual position and each final actual position for each desired calibration position, for the remaining desired calibration positions from the set of desired calibration positions, so that each desired calibration position from the set of desired calibration positions is processed; and
   determining, based on elements that include the determined differences for the set of desired calibration positions compensation coefficients to calibrate the laser processing machine.

2. The method according to claim 1, further comprising:
solving a non-linear least squares problem to determine the compensation coefficients.

3. The method of claim 1, wherein the light sensor is a segmented position sensitive detector (PSD).

4. The method of claim 1, wherein the light sensor is a lateral effect position sensitive detector.

5. The method of claim 1, wherein the measuring uses one or more resolvers, one or more encoders or both.

6. The method of claim 1, further comprising at least one first actuator and at least one second actuator, for each axis of motion of the laser beam on the work surface.

7. The system of claim 1, further comprising:
at least one servo loop in communication with actuators and at least one output of the light sensor, wherein the servo loop is closed.

8. A calibrating system comprising:
a laser processing machine comprising:
a work surface, wherein the work surface is configured to receive a work piece;
a scan head configured to direct a laser beam at each desired position on the work surface;
a light sensor configured to align with the laser beam of the scan head, wherein the light sensor is located on the work surface during calibration;
at least one position feedback device measures indirectly, along electromechanical paths of at least one actuator of the laser processing machine, an initial actual position of the laser beam;
a servo loop configured to control positions of the at least one actuator using measured position signals of the light sensor;
a processor in communication with a memory, the processor configured to:
obtain a set of stored desired calibration positions on the work surface of the laser processing machine from the memory;
direct the scan head to position the laser beam to a desired calibration position from the set of desired calibration positions on the work surface;
align the laser beam of the scan head with the working area of the light sensor using the processor;
measure indirectly by at least one position feedback device, along electromechanical paths of at least one actuator of the laser processing machine, an initial actual position of the laser beam;
use a servo loop configured to control positions of the at least one actuator using measured position signals of the light sensor via the processor, wherein the light sensor measures a position of the laser beam relative to a center of the working area of the light sensor, such that the servo loop causes the at least one actuator to alter a position of the laser beam to a center of the working area of the light sensor;
measure indirectly by the at least one position feedback device, along electromechanical paths of at least one actuator of the laser processing machine, a final actual position of the laser beam after the servo loop centers the laser beam on the center of the working area of the light sensor; and
determine, the difference between the initial actual position and the final actual position for the desired calibration position;
continue to determine, the difference between each initial actual position and each final actual position for each desired calibration position, for the remaining desired calibration positions from the set of desired calibration positions, so that each desired calibration position from the set of desired calibration positions is processed; and
determine, based on elements that include the determined differences for the set of desired calibration positions, compensation coefficients to calibrate the laser processing machine.

9. The system of claim 8, wherein the light sensor is a segmented position sensitive detector (PSD).

10. The system of claim 8, wherein the light sensor is lateral effect position sensitive detector.

11. The system of claim 8, further comprising:
an actuator for moving the scan head according to the compensation coefficients during operations of the laser processing machine after the laser processing machine is calibrated.

12. The system of claim 8, further comprising:
use the servo loop in communication with actuators to move the scan head relative to the light sensor and at least one output of the light sensor, wherein the servo loop is closed and the at least one output of the light sensor includes a position of the laser beam along an optical path of the laser beam at a working plane.

13. The method of claim 7, wherein the at least one servo loop is a position feedback loop of a proportional integral type.

14. The method of claim 7, wherein at least one actuator of the actuators is controlled by the at least one servo loop, and an input of the at least one servo loop is equal to an output of the light sensor, when the laser beam is centered.

15. The method of claim 14, wherein control action of the at least one servo loop drives a difference between the input to the at least one servo loop and the output of the light sensor to zero, and the at least one actuator is made to center the laser beam on the light sensor.

16. The method according to claim 7, wherein at least one actuator aligns the laser beam of the scan head with the light sensor, so that the desired calibration position coincides with the position of the light sensor.

17. The method of claim 1, wherein determining the compensation coefficients includes processing the elements configured to effect a processing of at least one calibration algorithm, the at least one calibration algorithm is embedded in the processor, and is provided to effect an error correction of the scan head based on the compensation coefficients stored within the memory.

18. The method of claim 1, wherein the set of desired calibration positions is a pattern on the work surface of the laser processing machine.

* * * * *